(12) United States Patent
Kim (10) Patent No.: US 10,319,270 B2
(45) Date of Patent: Jun. 11, 2019

(54) DISPLAY APPARATUS AND METHOD OF MANUFACTURING THE SAME

(71) Applicant: Samsung Display Co., Ltd., Yongin-si, Gyeonggi-do (KR)

(72) Inventor: Dongcheol Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 537 days.

(21) Appl. No.: 15/008,205

(22) Filed: Jan. 27, 2016

(65) Prior Publication Data

US 2016/0260366 A1    Sep. 8, 2016

(30) Foreign Application Priority Data

Mar. 6, 2015 (KR) ........................ 10-2015-0031867

(51) Int. Cl.
*G09G 3/20* (2006.01)
*H05K 1/18* (2006.01)

(52) U.S. Cl.
CPC ....... *G09G 3/20* (2013.01); *G09G 2300/0426* (2013.01); *H05K 1/189* (2013.01); *H05K 2201/10128* (2013.01)

(58) Field of Classification Search
CPC .. G09G 2300/0426; G09G 3/20; H05K 1/189; H05K 2201/10128
See application file for complete search history.

(56) References Cited

U.S. PATENT DOCUMENTS

| 2005/0088830 | A1* | 4/2005 | Yumoto | G02F 1/13452 361/749 |
| 2009/0174066 | A1* | 7/2009 | Yokoo | H01L 25/18 257/723 |
| 2013/0148072 | A1* | 6/2013 | Jang | G02F 1/13439 349/150 |
| 2015/0109550 | A1* | 4/2015 | Shimizu | G02F 1/13452 349/33 |

FOREIGN PATENT DOCUMENTS

| KR | 10-2011-0018572 A | 2/2011 |
| KR | 10-2014-0012399 A | 2/2014 |
| KR | 10-1373519 B1 | 3/2014 |
| KR | 10-1422746 B1 | 7/2014 |

OTHER PUBLICATIONS

English Abstract for KR 10-2008-0060615 A, dated Jul. 2, 2008, Which Corresponds to KR 10-1373519 B1 Listed Above, 1 page.
English Abstract for KR 10-2013-0117103 A, dated Oct. 25, 2013, Which Corresponds to KR 10-1422746 B1 Listed Above, 1 page.

* cited by examiner

*Primary Examiner* — Viet D Pham
(74) *Attorney, Agent, or Firm* — Lewis Roca Rothgerber Christie LLP (57) ABSTRACT

A display apparatus includes a display panel, a printed circuit board, and a driving chip package. The driving chip package includes a first terminal electrically connected to the display panel, a second terminal electrically connected to the printed circuit board, and a driving chip mounted on the display panel. One end of a first surface of the driving chip package on which the first terminal is arranged and one end of a second surface of the driving chip package on which the second terminal is arranged are spaced from each other in a thickness direction of the display panel.

19 Claims, 8 Drawing Sheets

DISPLAY APPARATUS AND METHOD OF MANUFACTURING THE SAME

CROSS-REFERENCE TO RELATED APPLICATION

This patent application claims priority to and the benefit of Korean Patent Application No. 10-2015-0031867, filed on Mar. 6, 2015 in the Korean Intellectual Property Office, the entire contents of which are hereby incorporated by reference.

BACKGROUND

The present disclosure relates to a display apparatus and a method of manufacturing the same.

Examples of display apparatuses include liquid crystal displays, field emission displays, plasma display panels, and organic electroluminescent displays. To operate a display apparatus, components for generating various control signals, data signals, etc., may be mounted at certain regions of a substrate of the display apparatus. Methods for mounting such components may be classified into a chip on glass (COG) method, a chip on flexible printed circuit (COF) method, and the like. The COG method is a method for directly mounting components, such as integrated circuit (IC) chips, on a substrate, and the COF method is a method for mounting a film on a substrate after mounting components, such as IC chips, on a film, such as a polyimide film.

SUMMARY

The present disclosure provides a display apparatus having a reduced non-display region and a method of manufacturing the same.

Embodiments of the inventive concept provide a display apparatus including: a display panel configured to display an image, a printed circuit board configured to generate a driving signal for driving the display panel, and a driving chip package including a first terminal electrically connected to the display panel, a second terminal electrically connected to the printed circuit board, and a driving chip mounted on the display panel, the driving chip packing configured to process the driving signal, wherein one end of a first surface of the driving chip package on which the first terminal is arranged and one end of a second surface of the driving chip package on which the second terminal is arranged are spaced from each other in a thickness direction of the display panel.

The display panel may include: a first substrate on which the first terminal is coupled; and a second substrate over the first substrate and facing the first substrate, wherein a distance between the one end of the first surface and the one end of the second surface is equal to or greater than a thickness of the first substrate, and wherein the driving chip package covers a portion of an upper surface of the first substrate which extends from an edge of the upper surface of the first substrate and a portion of a side surface of the first substrate which extends from the edge of the upper surface of the first substrate.

The printed circuit board may be under the first substrate and coupled to the second surface.

The driving chip package may include: a first wiring electrically connecting the first terminal and the driving chip; a second wiring electrically connecting the second terminal and the driving chip; a mold covering the driving chip, the first wiring, and the second wiring; and a third surface extending between the one end of the first surface and the one end of the second surface, wherein the first and third surfaces may contact the first substrate and may be coupled to the first substrate.

The third surface may be bent and extend from the one end of the first surface in a bent direction, the second surface may be bent and extend from one end of the third surface in a bent direction, and the first and second surfaces may not overlap with each other in a plan view.

The driving chip package may further include a third wiring which is covered by the mold and extends in the thickness direction, wherein the first terminal, the driving chip, the first wiring, and the second wiring may be arranged on a same plane, and the third wiring electrically may connect the second wiring and the second terminal.

The mold may include a first mold covering the first surface, the driving chip, the first terminal, the first wiring, and the second wiring; and a second mold covering the second surface, the third surface, the third wiring, and the second terminal.

The driving chip package may further include an adhesive between the first and second molds and connecting the first and second molds, wherein the adhesive may include a conductive material to electrically connect the second and third wirings.

The driving chip package may further include a first auxiliary terminal covered by the first mold and electrically connected to the second wiring.

The driving chip package may further include a second auxiliary terminal covered by the second mold and is electrically connected to the third wiring, and wherein the first and second auxiliary terminals may face with each other with the adhesive therebetween.

The second mold may have a thickness equal to or greater than the thickness of the first substrate.

The first and second molds may be integrally formed.

A plurality of driving chip packages may be provided, and the printed circuit board may be electrically connected to the second terminal of each of the plurality of driving chip packages.

In other embodiments of the inventive concept, a method of manufacturing a display apparatus includes: providing a display panel including first and second substrates; providing a printed circuit board at a rear surface of the first substrate; providing a driving chip package including first and second terminals and a driving chip; and coupling the driving chip package to a portion of an upper surface of the first substrate which extends from an edge of the upper surface of the first substrate and a portion of a side surface of the first substrate which extends from the edge of the upper surface of the first substrate.

The coupling of the driving chip package may include coupling the first terminal and the driving chip to the upper surface of the first substrate; and coupling the second terminal to the printed circuit board.

The coupling of the first terminal and the driving chip to an upper surface of the first substrate and the coupling of the second terminal to the printed circuit board may be sequentially performed or concurrently performed.

The driving chip package may include a first surface on which the first terminal is arranged, a second surface on which the second terminal is arranged, and a third surface extending between the first and second surfaces. The coupling of the driving chip package may include coupling the first surface to the upper surface of the first substrate, coupling the second surface to the printed circuit board, and coupling the third surface to the side surface of the first substrate.

The coupling of the driving chip package may include connecting the first terminal and the first substrate through a first adhesive; and connecting the second terminal and the printed circuit board through a second adhesive.

In still other embodiments of the inventive concept, a display apparatus includes: a display panel including first and second substrates; a printed circuit board at a rear surface of the first substrate; and a driving chip package including a first terminal on an upper surface of the first substrate, a driving chip mounted on the upper surface of the first substrate, and a second terminal connected to the printed circuit board, wherein the driving chip package covers a portion of an upper surface of the first substrate which is extends from an edge of the upper surface of the first substrate and a portion of a side surface of the first substrate which extends from the edge of the upper surface of the first substrate.

The driving chip package may include a first surface on which the first terminal is arranged; a second surface on which the second terminal is arranged; and a third surface extending between the first and second surfaces, wherein the first surface may be coupled to the upper surface of the first substrate, the second surface may be coupled to the printed circuit board, and the third surface may be coupled to a side surface of the first substrate.

BRIEF DESCRIPTION OF THE DRAWINGS

The accompanying drawings are included to provide a further understanding of the inventive concept and are incorporated in and constitute a part of this specification. The drawings illustrate exemplary embodiments of the inventive concept and, together with the description, serve to explain certain aspects of the inventive concept. In the drawings.

DETAILED DESCRIPTION

Exemplary embodiments of the present invention will be described below in more detail with reference to the accompanying drawings. Features and aspects of the inventive concept will be understood without difficulty through the described exemplary embodiments below referring to the accompanying drawings. The inventive concept may, however, be embodied in different forms and should not be construed as limited to the embodiments set forth herein. Rather, these embodiments are provided so that this disclosure will be thorough and complete, and will fully convey the scope of the present invention to those skilled in the art. Accordingly, the scope of the present disclosure should not be construed as limited to the embodiments set forth herein. Meanwhile, like reference numerals in the following embodiments and drawings denote like elements.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

It will be understood that when an element or layer is referred to as being "on", "connected to", or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention only and is not intended to be limiting of the described example embodiments or the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The components for generating various signals and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components for generating various signals may be formed on one integrated circuit (IC) chip or on separate IC chips. Further, the various components for generating various signals may be implemented on a flexible printed circuit film, a tape carrier package (TCP), a printed circuit board (PCB), or formed on a same substrate as the components for generating various signals. Further, the various components for generating various signals may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Figure 1:
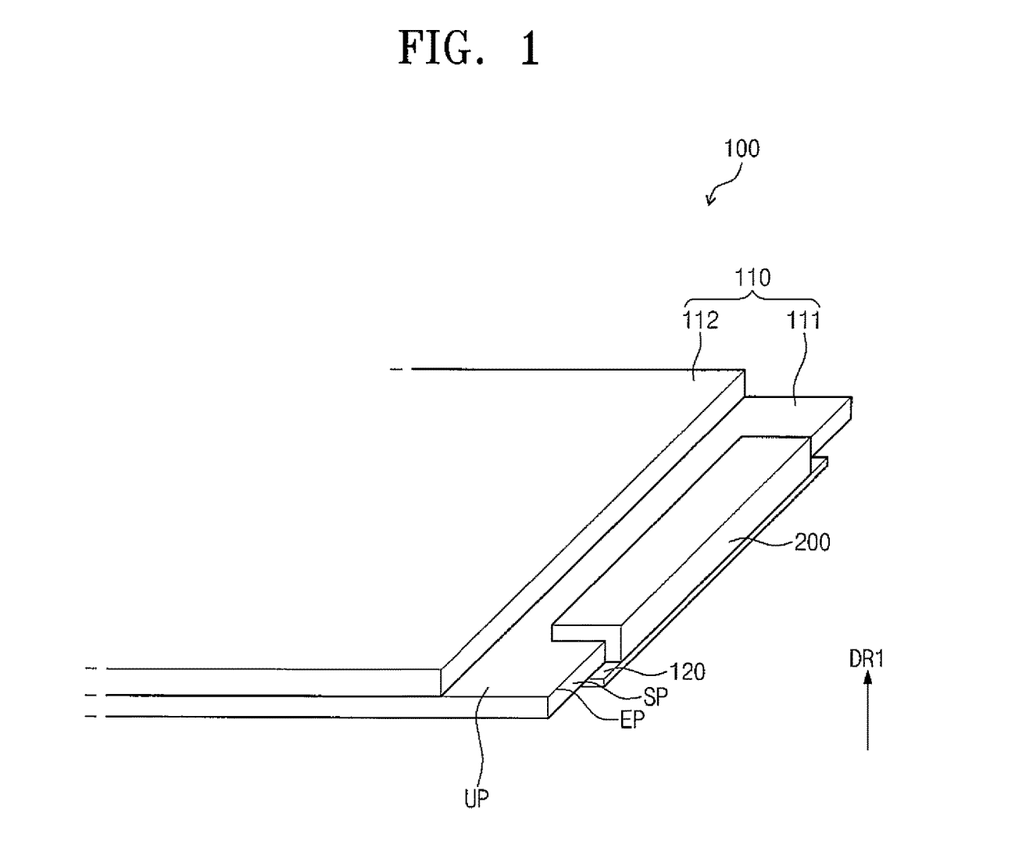
FIG. 1 is a perspective view of a display device according to an embodiment of the inventive concept.
Figure 2:
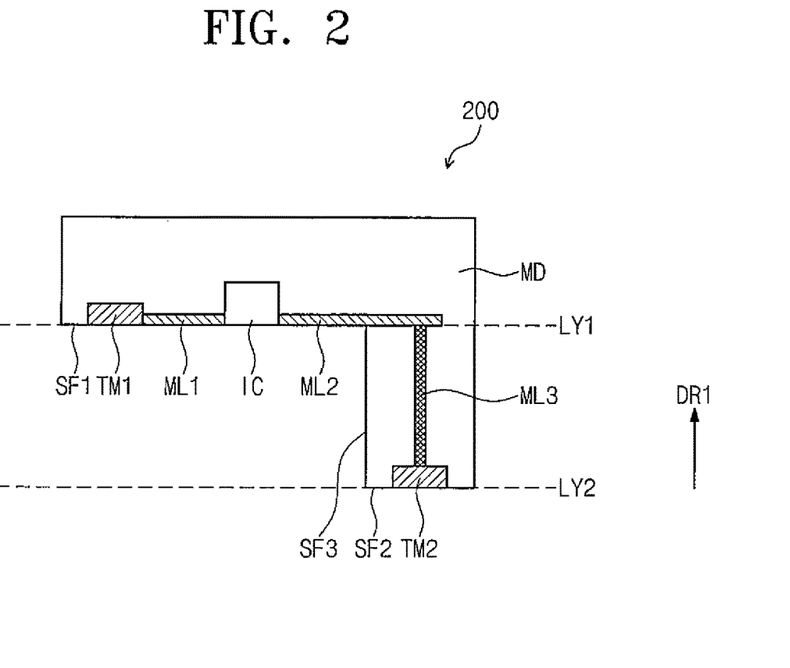
FIG. 2 is a cross-sectional view of a driving chip package according to an embodiment of the inventive concept.

FIG. 1 is a perspective view of a display apparatus according to an embodiment of the inventive concept, and FIG. 2 is a cross-sectional view of a driving chip package according to an embodiment of the inventive concept.

Referring to FIGS. 1 and 2, a display apparatus 100 may include a display panel 110, a printed circuit board 120, and a driving chip package 200.

The display apparatus 100 may be variously employed, such as an organic light emitting display apparatus, a liquid crystal display apparatus, a plasma display apparatus, an electrophoretic display apparatus, and an electrowetting display apparatus. An embodiment in which the display apparatus is an organic light emitting display apparatus will be described as an example.

The display panel 110 may have a rectangular plate shape including two pairs of sides. In the embodiments described below, including the embodiment illustrated in FIG. 1, the display panel 110 may have a rectangular shape including one pair of long sides and one pair of short sides. The display panel 110 may include a first substrate 111 and a second substrate 112 which is disposed on the first substrate 111 and faces the first substrate 111. The first substrate 111 may include an organic light emitting element including a light emitting material and a transistor driving the organic light emitting element. The organic light emitting element may generate light corresponding to the light emitting material. The color of the light generated by the organic light emitting element may include red, green, blue, and white but is not limited thereto. The second substrate 112 may cover the organic light emitting element and block air, water, etc. to protect the organic light emitting element.

The printed circuit board 120 may be electrically connected to the first substrate 111. The printed circuit board 120 may be a flexible printed circuit (FPC). For example, the printed circuit board 120 may include a base substrate, and the base substrate may be a flexible substrate made of plastic, such as polyimide or polyester.

The driving chip package 200 may be electrically connected to each of the printed circuit board 120 and the first substrate 111. The driving chip package 200 may include a driving chip IC, a first terminal TM1, a second terminal TM2, a first wiring ML1, a second wiring ML2, a third wiring ML3, a mold MD, a first surface SF1 on which the first terminal TM1 is disposed, a second surface SF2 on which the second terminal TM2 is disposed, and a third surface SF3 connecting (e.g., extending between) one end of the first surface SF1 and one end of the second surface SF2.

The driving chip IC may provide a data signal for displaying an image on the display panel 110 and may be disposed on an upper surface UP of the first substrate 111. The driving chip IC may process a driving signal input from the printed circuit board 120 and provide the data signal to a data line. The driving signal may include an image signal, various control signals, etc. The driving chip package 200 may be mounted on the first substrate 111 through a chip on glass (COG) method.

The first terminal TM1 may transmit the data signal to a first pad part (PAD1 of FIG. 4) (e.g., a first pad) of the first substrate 111, and the second terminal TM2 may receive the driving signal from the printed circuit board 120. The first terminal TM1 may be disposed on the first surface SF1, and the second terminal TM2 may be disposed on the second surface SF2. One end of the first surface SF1 and one end of the second surface SF2 may be spaced from each other (e.g., spaced apart from each other) in a thickness direction (hereinafter referred to as a first direction DR1) of the display panel 110.

The third surface SF3 may be bent and extend from one end of the first surface SF1, and the second surface SF2 may be bent and extend from one end of the third surface SF3. The first surface SF1 may be parallel to the second surface SF2. In a cross-sectional view, the first surface SF1, the third surface SF3, and the second surface SF2 may be connected to each other to have a stepped shape.

The first wiring ML1 may electrically connect the first terminal TM1 and the driving chip IC, and the second wiring ML2 may electrically connect the second terminal TM2 and the driving chip IC. Both of the first and second wirings ML1 and ML2 may be disposed on a first planar surface LY1 which is coplanar with the first surface SF1. The first planar surface LY1 may be a virtual surface which is extended from (e.g., which extends beyond) the first surface SF1.

The second planar surface LY2, which is coplanar with the second surface SF2 on which the second terminal TM2 is disposed, may be coplanar with a rear surface of the first substrate 111 or may be lower than (e.g., below) a rear surface of the first substrate 111. The second planar surface LY2 may be a virtual surface which is extended from (e.g., which extends beyond) the second surface SF2.

The third wiring ML3 may be disposed inside the mold MD and may extend along the first direction DR1. The third wiring ML3 may electrically connect the second wiring ML2 disposed on the first planar surface LY1 and the second terminal disposed on the second surface SF2.

The mold MD may cover (e.g., encapsulate) the driving chip IC, the first wiring ML1, the second wiring ML2, and the third wiring ML3. The mold MD may include an insulating material.

The driving chip package 200 may cover an edge EP of the upper surface UP of the first substrate 111. The driving chip package 200 may be attached to a portion of the upper surface UP of the first substrate 111 which is connected to the edge EP of the upper surface UP of the first substrate 111 and to a portion of a side surface SP of the first substrate 111 which is connected to the edge EP of the first substrate 111. The driving chip package 200 may have a shape corresponding to a portion of the first substrate 111 adjacent to a region in which the driving chip IC is mounted. For example, when an angle defined by the upper surface of the first substrate 111 and the side surface of the first substrate 111 is a right angle, the angle defined by the first surface SF1 and the third surface SF3 may be a right angle.

A gate driving circuit is provided at a side of the first substrate 111 differing from a side (e.g., another side) to which the driving chip package 200 is attached and applies a gate signal to the gate line. The gate driving circuit may be formed at the other side of the substrate 111 through a thin film process which forms the display panel 110. Accordingly, the gate driving circuit may be accommodated in the display panel 110. In another embodiment, differing from the embodiment described with reference to FIG. 1, a gate driving chip may be provided at the other side of the substrate 111 to apply the gate signal to the gate line.

Figure 3:
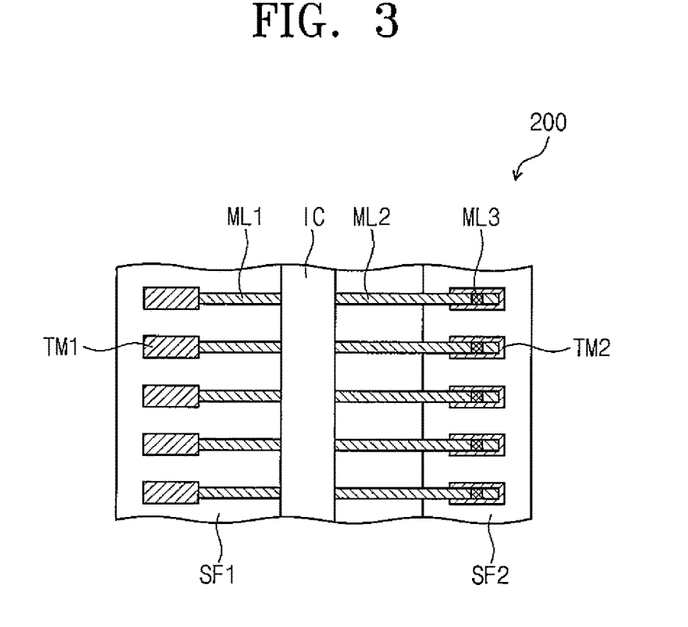
FIG. 3 is a plan view of the driving chip package illustrated in FIG. 2.

FIG. 3 is a plan view of the driving chip package illustrated in FIG. 2. In the description with reference to FIG. 3, components that have been previously described with reference to FIGS. 1 and 2 will be designated by the same reference numerals and overlapping descriptions thereof may not be provided.

Referring to FIG. 3, each of the first and second surfaces SF1 and SF2 may extend in a direction away from the third surface SF3 (SF3 in FIG. 2). Accordingly, the first and second surfaces SF1 and SF2 may not overlap on a plane. For example, the driving chip package 200 may have a cross-section having a stepped shape.

Figure 4:
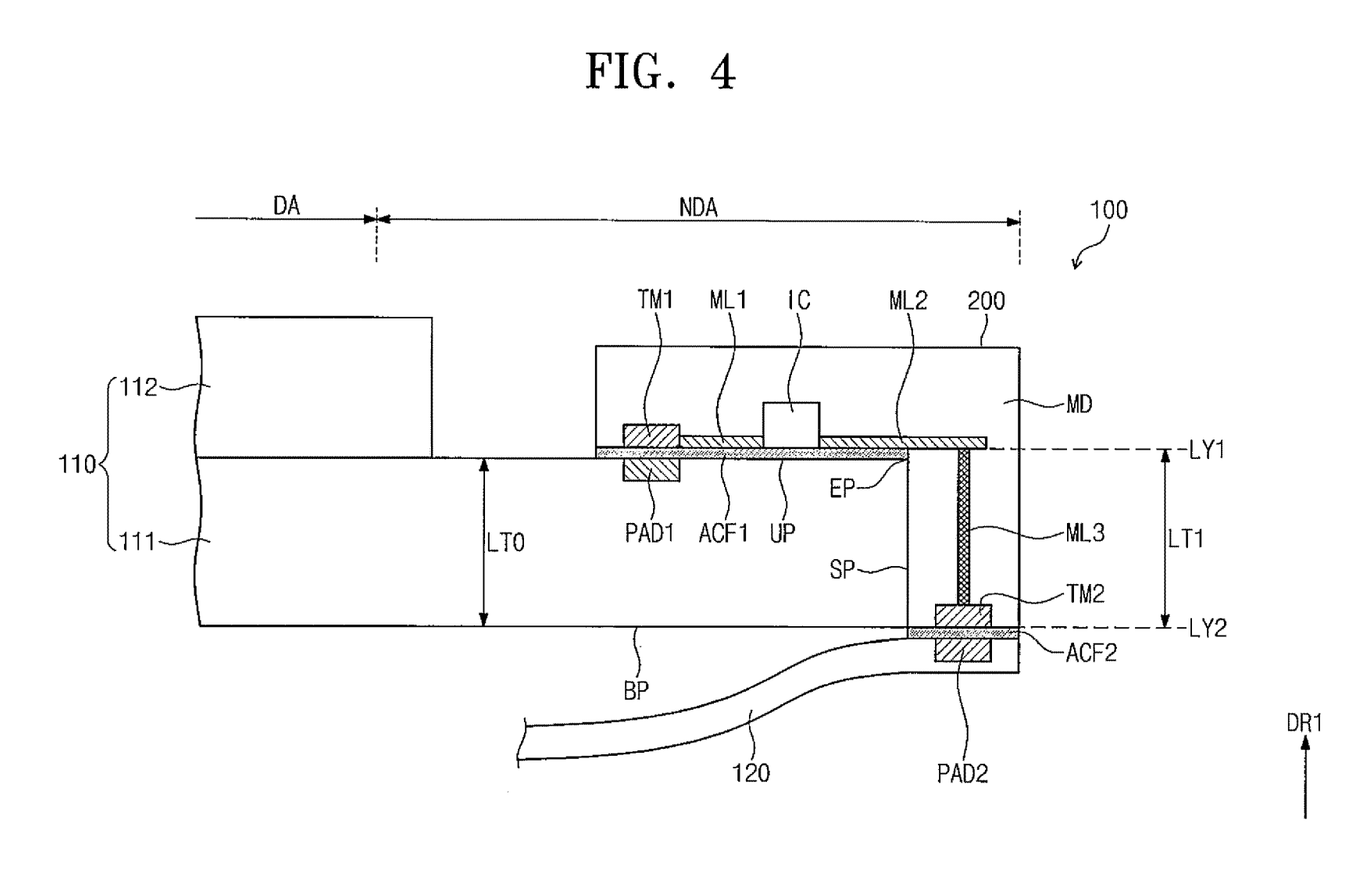
FIG. 4 is a cross-sectional view of the display apparatus illustrated in FIG. 1.

FIG. 4 is a cross-sectional view of the display apparatus illustrated in FIG. 1. In the description with reference to FIG. 4, components that have been previously described with reference to FIGS. 1 and 2 will be designated by the same reference numerals and overlapping descriptions thereof may not be provided.

Referring to FIG. 4, the driving chip package 200 may cover an edge EP of an upper surface UP of the first substrate 111. A first pad part PAD1 (e.g., a first pad) of the first substrate 111 may be electrically connected to the first terminal TM1, and a second pad part PAD2 (e.g., a second pad) of the printed circuit board 120 may be electrically connected to the second terminal TM2. The first pad part PAD1 and the first terminal TM1 are electrically connected by a first adhesive ACF1, and the second pad part PAD2 and the second terminal TM2 are electrically connected by a second adhesive ACF2. Each of the first and second adhesives ACF1 and ACF2 may include a conductive material. For example, each of the first and second adhesives ACF1 and ACF2 may include a micro-conductive particle, such as nickel, carbon, and/or lead particles, and insulating adhesives. Each of the first and second adhesives ACF1 and ACF2 may be an anisotropic conductive film (ACF).

A distance LT1 between one end of the first surface SF1 and one end of the second surface SF2 may be equal to or greater than a thickness LT0 of the first substrate 111. Accordingly, the first terminal TM1 may be on (e.g., attached to) the first substrate 111, and the second terminal TM2 may be positioned at a layer which is coplanar with or lower than (e.g., below) a rear surface BP of the first substrate 111. As a result, the printed circuit board 120 disposed under the first substrate 111 may be easily connected to the second terminal TM2.

The distance LT1 between one end of the first surface SF1 and one end of the second surface SF2 may be the same or substantially the same as a distance between the first planar surface LY1 and the second planar surface LY2, which are substantially parallel to each other.

The driving chip package 200 may cover the edge EP of the first substrate 111 and may extend to the rear surface BP of the first substrate 111. Accordingly, the printed circuit board 120 can be electrically connected to the first substrate 111 without being bent (e.g., without being substantially bent). For example, the printed circuit board 120 may be disposed at the rear surface BP of the first substrate 111 and may be electrically connected to the second terminal TM2 without being connected to (e.g., without being bent to connect to) an upper surface UP of the first substrate 111.

The display panel 110 may include a display region DA for displaying an image and a non-display region NDA on which the image is not displayed. The driving chip package 200 may be disposed at the non-display region NDA. Different from the embodiments of the inventive concept, when the printed circuit board is bent from a rear surface of the first substrate toward an upper surface of the first substrate, a region to which the printed circuit board is attached to the substrate should be separately defined on the first substrate. Also, a bending area should be secured as the printed circuit board is bent (e.g., an area in which the printed circuit board can be bent into should be provided). However, according to an embodiment of the inventive concept, because only an area for attaching the driving chip package 200 is required to be secured in the non-display region NDA, the width of the non-display region NDA may be reduced. Also, because a separate bending area does not need to be defined, the width of a bezel may be substantially the same as a width of the non-display area NDA. As a result, a display apparatus 100 having a relatively narrow bezel may be easily provided.

Also, because the printed circuit board 120 is not bent (e.g., is not substantially bent to connect to the upper surface UP of the substrate 111), the second pad part PAD2 of the printed circuit board 120 may be prevented from being lifted off from the attached surface. Also, a crack in a wiring caused by the bending of the printed circuit board may be prevented, and therefore, the reliability of the display apparatus 100 may be improved.

Figure 5:
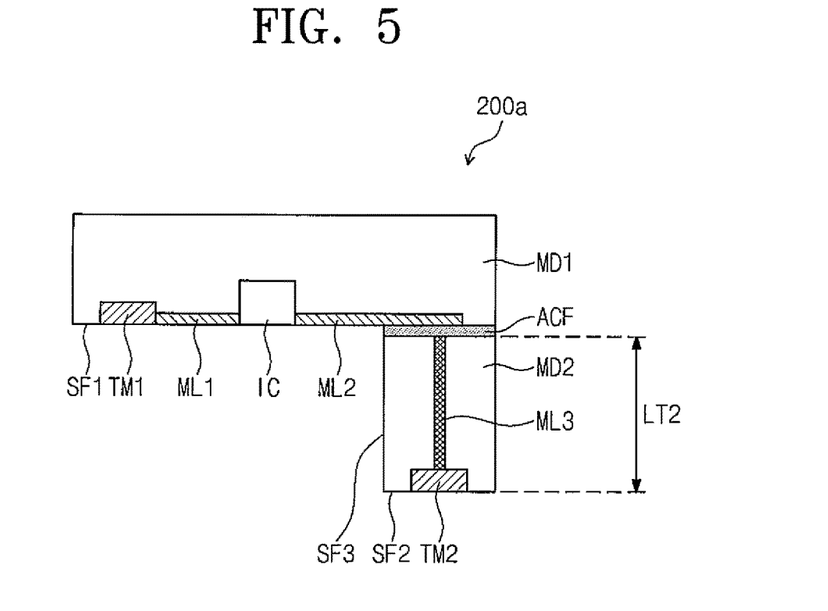
FIG. 5 is a cross-sectional view of a driving chip package according to another embodiment of the inventive concept.

FIG. 5 is a cross-sectional view of a driving chip package according to another embodiment of the inventive concept. In the following description with reference to FIG. 5, components that have been previously described with reference to FIGS. 1-4 will be designated by the same reference numerals and overlapping descriptions thereof may not be provided.

Referring to FIG. 5, a driving chip package 200a may include a first mold MD1 and a second mold MD2. The first mold MD1 may cover a driving chip IC, a first wiring ML1, and a second wiring ML2. The second mold MD2 may cover a third surface SF3, a third wiring ML3, and a second terminal TM2.

The driving chip package 200a may be disposed in the first mold MD1 and the second mold MD2 and may further include an adhesive ACF connecting the first mold MD1 and the second mold MD2 to each other. For example, the adhesive ACF may include a micro-conductive particle, such as nickel, carbon, or lead particles, and insulating adhesives. The adhesive ACF may be an anisotropic conductive film.

The thickness of the second mold MD2 may be equal to or greater than the thickness (LT0 of FIG. 4) of the first substrate (111 of FIG. 4). Accordingly, the second terminal TM2 may be disposed at a layer which is coplanar with or lower than (e.g., below) a rear surface (BP of FIG. 4) of the first substrate (111 of FIG. 4). Accordingly, the printed circuit board (120 of FIG. 4) may be easily attached to the second terminal TM2 without being bent. As a result, the width of a bezel may be reduced. Also, because the printed circuit board (120 of FIG. 4) is not bent, a crack in wiring or a lifted connection may be prevented, and thus, the reliability of the display apparatus (100 of FIG. 1) may be improved.

The first and second molds MD1 and MD2 may be separately formed. For example, after being formed, the first and second molds MD1 and MD2 may be attached to each other by the adhesive ACF. Accordingly, the manufacturing process of the driving chip package 200a may be more easily performed.

In another embodiment, different from the currently-described embodiment of the inventive concept, the first and second molds MD1 and MD2 may have an integral shape (e.g., may be integrally formed). When the first and second molds MD1 and MD2 have an integral shape, the integral shape may be substantially the same as a shape of the driving chip package 200 illustrated in FIG. 2.

Figure 6:
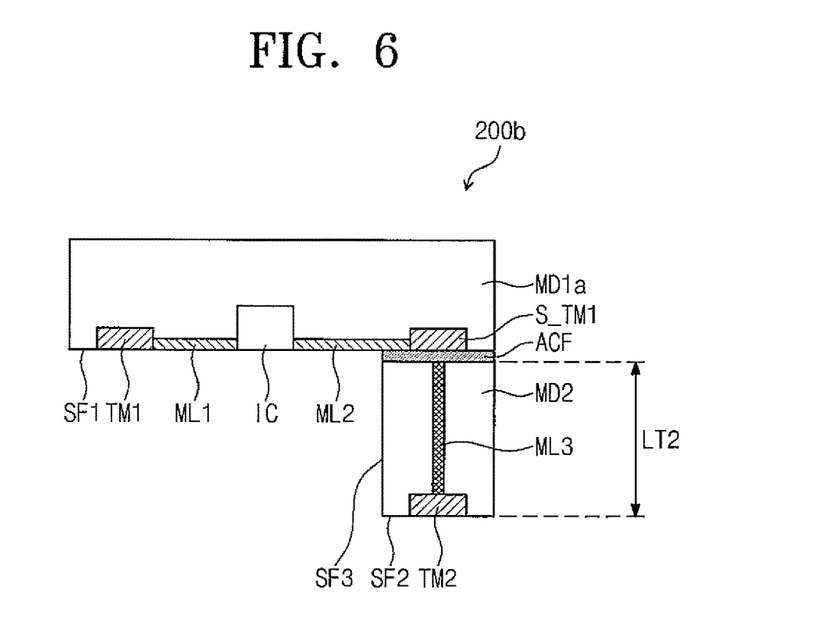
FIG. 6 is a cross-sectional view of a driving chip package according to another embodiment of the inventive concept.

FIG. 6 is a cross-sectional view of a driving chip package according to another embodiment of the inventive concept. In the following description with reference to FIG. 6, components that have been previously described with reference to FIGS. 1-5 will be designated by the same reference numerals and overlapping descriptions thereof may not be provided.

Referring to FIG. 6, a driving chip package 200b may further include a first auxiliary terminal S_TM1 which is covered by a first mold MD1a and electrically connected to a second wiring ML2. The first auxiliary terminal S_TM1 may be electrically connected to a third wiring ML3. The first auxiliary terminal S_TM1 may face one end of the third wiring ML3 with the adhesive ACF disposed therebetween. According to the embodiment described with reference to FIG. 6, because the width of the first auxiliary terminal S_TM1 is greater than that of the second wiring ML2, the first auxiliary terminal S_TM1 and the third wiring ML3 may be more easily aligned. Also, because the first and second molds MD1a and MD2 are separately formed and then attached to each other by the adhesive ACF, the manufacturing process of the driving chip package 200b may be more easily performed.

A first terminal TM1 of the first mold MD1a may be attached to the first substrate (111 of FIG. 4). The second mold MD2 may be disposed between the first mold MD1a and the printed circuit board (120 of FIG. 4), and the second terminal TM2 may be attached to the printed circuit board (120 of FIG. 4). Accordingly, the printed circuit board (120 of FIG. 4) may be electrically connected to the first substrate (111 of FIG. 4) without being bent. As a result, the width of a bezel may be reduced. Also, because the printed circuit board (120 of FIG. 4) is not bent (e.g., is not substantially bent), a crack in a wiring or a lifted connection may be prevented, and thus, the reliability of the display apparatus (100 of FIG. 1) may be improved.

Figure 7:
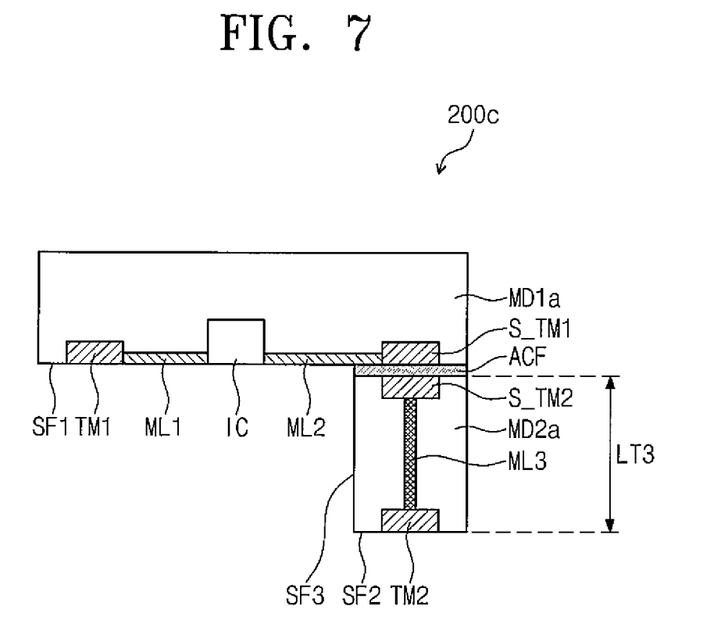
FIG. 7 is a cross-sectional view of a driving chip package according to another embodiment of the inventive concept.

FIG. 7 is a cross-sectional view of a driving chip package according to another embodiment of the inventive concept.

In the below description with reference to FIG. 7, components that have been previously described with reference to FIG. 6 will be designated by the same reference numerals, and overlapping descriptions thereof may not be provided.

Referring to FIG. 7, a driving chip package 200c may further include a second auxiliary terminal S_TM2 which is covered by a second mold MD2a and electrically connected to a third wiring ML3. The second auxiliary terminal S_TM2 may face the first auxiliary terminal S_TM1 with the adhesive ACF disposed therebetween. Because the width of the second auxiliary terminal S_TM2 is greater than that of the third wiring ML3, the first auxiliary terminal S_TM1 and the second auxiliary terminal S_TM2 may be more easily aligned. Also, because a first mold MD1a and the second mold MD2a are separately formed and then attached to each other by an adhesive ACF, the manufacturing process of the driving chip package 200c may be more easily performed.

Figure 8:
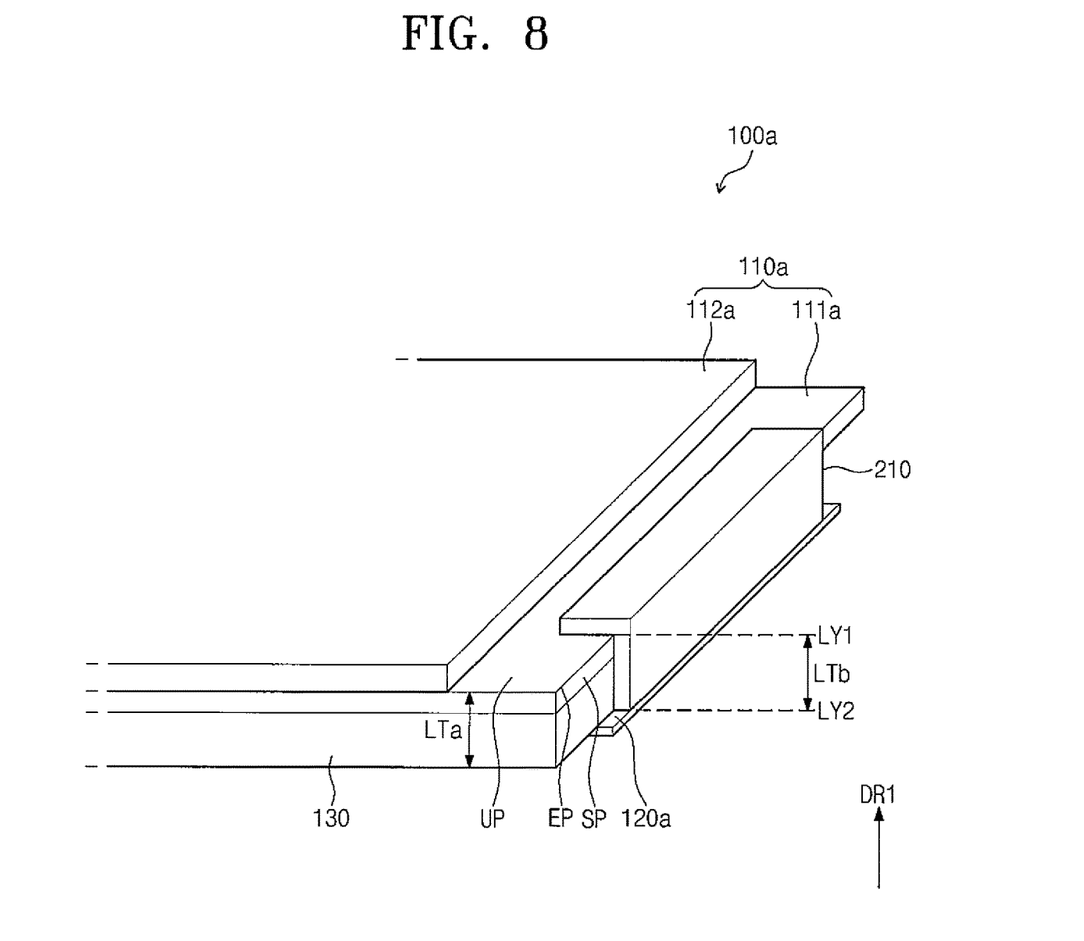
FIG. 8 is a perspective view of a display device according to another embodiment of the inventive concept.

FIG. 8 is a perspective view of a display device according to an embodiment of the inventive concept.

Referring to FIG. 8, the display apparatus 100a may be a liquid crystal display apparatus. The display apparatus 100a may include a display panel 110a and a backlight unit 130.

The display panel 110a may receive light to display an image. The display panel 110a may include a first substrate 111a, a second substrate 112a facing the first substrate 111a, and a liquid crystal layer disposed between the first substrate 111a and the second substrate 112a.

The backlight unit 130 may be disposed under the display panel 110a and provide light to the display panel 110a. The backlight unit 130 may include a light source, optical sheets, and/or a bottom chassis, etc. The light source may generate light, the optical sheets may adjust the optical path, and the bottom chassis may accommodate the light source and the optical sheets. When the backlight unit 130 is an edge-type backlight unit, the light source may be disposed at one side of the bottom chassis and the backlight unit 130 may further include a light guide panel. When the backlight unit 130 is a direct-type backlight unit, the light source may be disposed at an upper surface of the bottom chassis.

A driving chip package 210 may cover an edge EP of an upper surface UP of the first substrate 111a. In the currently-described embodiment, the internal structure of the driving chip package 210 may be substantially the same or the same as the driving chip package (200 of FIG. 2) illustrated in FIG. 2. A distance LTb between one end of a first surface (SF1 of FIG. 2) on which a first terminal (TM of FIG. 2) is disposed and one end of a second surface (SF2 of FIG. 2) on which a first terminal (TM of FIG. 2) is disposed may be equal to or greater than the thickness LTa of the first substrate 111 and the backlight unit 130. Accordingly, the second planar surface LY2, which is coplanar with the second surface SF2 on which the second terminal TM2 is disposed, may be coplanar with or lower than (e.g., below) a rear surface of the backlight unit 130. Therefore, the printed circuit board 120a may be easily attached to the second terminal TM2 without being bent. As a result, the width of a bezel of the display apparatus 100a may be reduced. Also, because the printed circuit board 120a is not bent, a crack in wiring or a lift-off of a connection may be prevented, and thus, the reliability of the display apparatus 100a may be improved.

Figure 9:
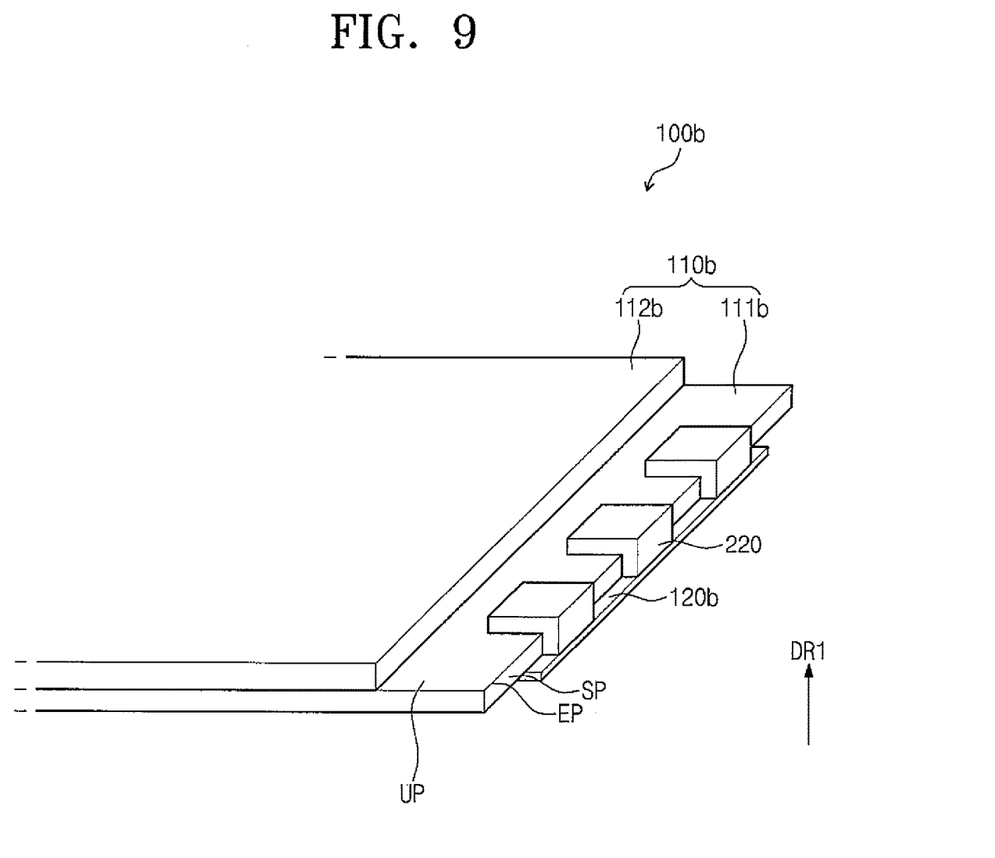
FIG. 9 is a perspective view of a display apparatus according to another embodiment of the inventive concept.

FIG. 9 is a perspective view of a display apparatus according to another embodiment of the inventive concept.

Referring to FIG. 9, a display apparatus 100b may include a display panel 110b, a plurality of driving chip packages 220, and a printed circuit board 120b.

The display panel 110b may include a first substrate 111b and a second substrate 112b.

Each of the driving chip packages 220 may be disposed at an edge EP of an upper surface UP of the first substrate 111b. Each of the driving chip packages 220 may have the same or substantially the same structure as the driving chip package (200 in FIG. 2) illustrated in FIG. 2.

A first terminal (TM1 of FIG. 2) of each of the driving chip packages 220 may be attached to the first substrate 111b, and a second terminal (TM2 of FIG. 2) of each of the driving chip packages 220 may be attached to the printed circuit board 120b. In the embodiment illustrated in FIG. 9, one printed circuit board 120b may be electrically connected to the first substrate 111b by the plurality of driving chip packages 220.

A tape carrier package electrically connecting the printed circuit board 120b and the first substrate 111b may not be included, and the printed circuit board may not be bent. Accordingly, even when the driving chip packages 220 are provided in plurality, the alignment for electrically connecting the printed circuit board 120b and the first substrate 111b may be more easily performed. Also, because a space for attaching the tape carrier package, the printed circuit board, etc., and a bending area are not required to be secured, the bezel width of the display apparatus 100b may be reduced. Also, because the printed circuit board 120b is not bent, a crack in wiring or a lift-off of a connection may be prevented, and thus, the reliability of the display apparatus 100b may be improved.

Figure 10:
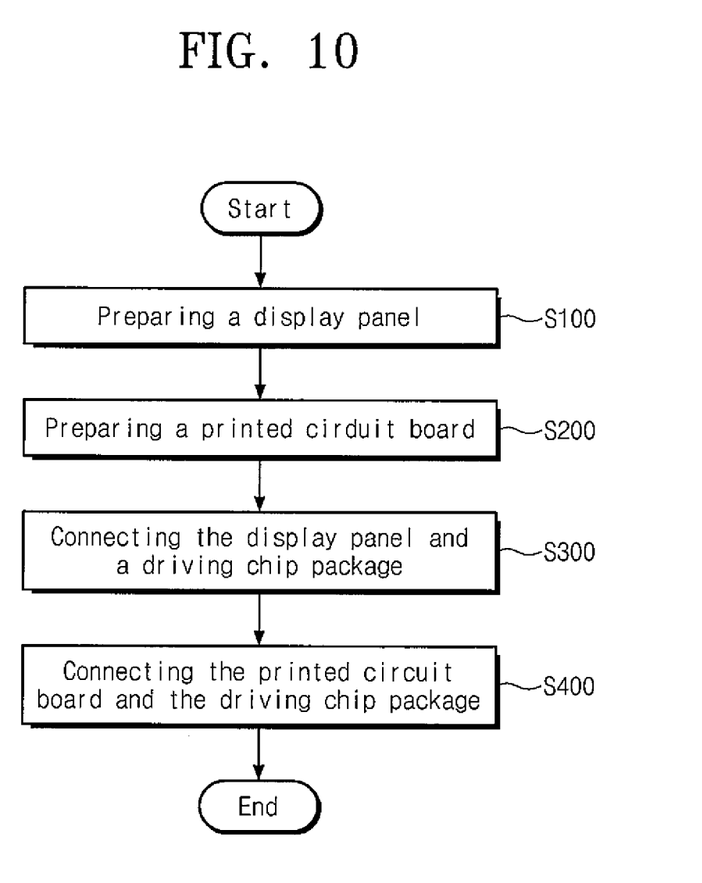
FIG. 10 is a flowchart schematically illustrating a method of manufacturing a display apparatus according to an embodiment of the inventive concept.

FIG. 10 is a flowchart schematically illustrating a method of manufacturing a display apparatus according to an embodiment of the inventive concept.

Referring to FIGS. 4 and 10, a method of manufacturing a display apparatus according to an embodiment of the inventive concept may include: preparing a display panel 110 (S110); preparing a printed circuit board 120 (S200); connecting the display panel 110 and the driving chip package 200 to each other (S300); and connecting the printed circuit board 120 and the driving chip package 200 to each other (S400).

The connecting of the display panel 110 and the driving chip package 200 to each other (S300) and the connecting of the printed circuit board 120 and the driving chip package 200 to each other (S400) may be sequentially performed; however, the inventive concept is not limited thereto. Thus, the connecting of the display panel 110 and the driving chip package 200 to each other (S300) and the connecting of the printed circuit board 120 and the driving chip package 200 to each other (S400) may be concurrently (e.g., simultaneously) performed. A first surface SF1 of the driving chip package 200 may be attached to an upper surface UP of a first substrate 111, a second surface SF2 of the driving chip package 200 may be attached to the printed circuit board 120, and a third surface SF3 of the driving chip package 200 may be attached to a side surface SP of the first substrate 111. Accordingly, the driving chip package 200 may cover a portion of an edge EP of the upper surface UP of the first substrate 111, a portion of the upper surface UP of the first substrate 111, and a portion of the side surface SP edge EP of the first substrate 111 adjacent to an edge EP of the upper surface UP of the first substrate 111.

The connecting of the display panel 110 and the driving chip package 200 to each other (S300) may include attaching the display panel 110 and a first terminal TM1 of the driving chip package 200 by using a first adhesive ACF1.

The connecting of the printed circuit board 120 and the driving chip package 200 to each other (S400) may include attaching the printed circuit board 120 and a second terminal TM2 of the driving chip package 200 by a second adhesive ACF2.

According to embodiments of the inventive concept, a driving chip package includes a first terminal disposed on a first layer and a second terminal disposed on a second layer which is spaced from (e.g., spaced apart from) the first layer in a thickness direction of a display panel. The driving chip package may be attached to an edge of an upper surface of a first substrate and have a shape corresponding to the shape of the edge of the substrate. Accordingly, the driving chip package may be attached to the edge of the first substrate and to a side surface of the first substrate adjacent to the edge of the first substrate. Thus, because a printed circuit board or a tape carrier package is not bent, a bending region may not be provided in the display panel. Also, because only a region to which the driving chip package is attached is necessary, a region to which the printed circuit board or the tape carrier is attached may not be provided. As a result, a width of a bezel may be decreased.

According to embodiments of the inventive concept, because a separate tape carrier is not required, the number of components may be reduced. Also, because the printed circuit board is not bent, cracking in a wiring of the printed circuit board caused by bending may be prevented. Thus, the reliability of a product may be improved.

It will be apparent to those skilled in the art that various modifications and variations can be made in the present invention. Thus, it is intended that the present invention covers the modifications and variations of this invention provided they come within the scope of the appended claims and their equivalents. Therefore, the scope of the inventive concept is defined not by the detailed description of the inventive concept but by the appended claims and their equivalents.

What is claimed is:

1. A display apparatus comprising:
   a display panel configured to display an image;
   a printed circuit board configured to generate a driving signal for driving the display panel; and
   a driving chip package comprising a first terminal electrically connected to the display panel, a second terminal electrically connected to the printed circuit board, and a driving chip mounted on the display panel, the driving chip configured to process the driving signal,
   wherein one end of a first surface of the driving chip package on which the first terminal is arranged and one end of a second surface of the driving chip package on which the second terminal is arranged are spaced from each other in a thickness direction of the display panel, and the second surface is different from the first surface, and
   wherein the first terminal overlaps the display panel in a plan view in a direction normal to a display surface of the display panel, and the second terminal is offset from the display panel in the plan view.

2. The display apparatus of claim 1, wherein the display panel comprises:
   a first substrate on which the first terminal is coupled; and
   a second substrate over the first substrate and facing the first substrate,
   wherein a distance between the one end of the first surface and the one end of the second surface is equal to or greater than a thickness of the first substrate, and
   wherein the driving chip package covers a portion of an upper surface of the first substrate which extends from an edge of the upper surface of the first substrate and a portion of a side surface of the first substrate which extends from the edge of the upper surface of the first substrate.

3. The display apparatus of claim 2, wherein the printed circuit board is under the first substrate and is coupled to the second surface.

4. The display apparatus of claim 2, wherein the driving chip package comprises:
a first wiring electrically connecting the first terminal and the driving chip;
a second wiring electrically connecting the second terminal and the driving chip;
a mold covering the driving chip, the first wiring, and the second wiring; and
a third surface extending between the one end of the first surface and the one end of the second surface,
wherein the first and third surfaces contact the first substrate and are coupled to the first substrate.

5. The display apparatus of claim 4, wherein the third surface is bent and extends from the one end of the first surface, the second surface is bent and extends from one end of the third surface, and the first and second surfaces do not overlap with each other in the plan view.

6. The display apparatus of claim 4, wherein the driving chip package further comprises a third wiring which is covered by the mold and extends in the thickness direction, wherein the first terminal, the driving chip, the first wiring, and the second wiring are arranged on a same plane, and the third wiring electrically connects the second wiring and the second terminal.

7. The display apparatus of claim 6, wherein the mold comprises:
a first mold covering the first surface, the driving chip, the first terminal, the first wiring, and the second wiring; and
a second mold covering the second surface, the third surface, the third wiring, and the second terminal.

8. The display apparatus of claim 7, wherein the driving chip package further comprises an adhesive between the first and second molds and connecting the first and second molds,
wherein the adhesive comprises a conductive material to electrically connect the second and third wirings.

9. The display apparatus of claim 8, wherein the driving chip package further comprises a first auxiliary terminal covered by the first mold and electrically connected to the second wiring.

10. The display apparatus of claim 9, wherein the driving chip package further comprises a second auxiliary terminal covered by the second mold and electrically connected to the third wiring,
wherein the first and second auxiliary terminals face each other with the adhesive therebetween.

11. The display apparatus of claim 7, wherein the second mold has a thickness equal to or greater than the thickness of the first substrate.

12. The display apparatus of claim 7, wherein the first and second molds are integrally formed.

13. The display apparatus of claim 1, further comprising a plurality of the driving chip packages, and
wherein the printed circuit board is electrically connected to the second terminal of each of the plurality of driving chip packages.

14. A method of manufacturing a display apparatus, the method comprising:
providing a display panel comprising first and second substrates;
providing a printed circuit board at a rear surface of the first substrate;
providing a driving chip package comprising first and second terminals and a driving chip, the driving chip being connected between the first and second terminals;
coupling the first terminal and the driving chip of the driving chip package to a portion of an upper surface of the first substrate which extends from an edge of the upper surface of the first substrate;
coupling the second terminal of the driving chip package to the printed circuit board; and
contacting the driving chip package to a portion of a side surface of the first substrate which extends from the edge of the upper surface of the first substrate.

15. The method of claim 14, wherein the coupling of the first terminal and the driving chip to the upper surface of the first substrate and the coupling of the second terminal to the printed circuit board are sequentially performed or concurrently performed.

16. The method of claim 14, wherein the driving chip package comprises a first surface on which the first terminal is arranged, a second surface on which the second terminal is arranged, and a third surface extending between the first and second surfaces, and
wherein the coupling of the driving chip package comprises:
coupling the first surface to the upper surface of the first substrate;
coupling the second surface to the printed circuit board; and
coupling the third surface to the side surface of the first substrate.

17. A method of claim 14, wherein the coupling of the driving chip package comprises connecting the first terminal and the first substrate through a first adhesive; and connecting the second terminal and the printed circuit board through a second adhesive.

18. A display apparatus comprising:
a display panel comprising first and second substrates;
a printed circuit board at a rear surface of the first substrate; and
a driving chip package comprising a first terminal on an upper surface of the first substrate, a driving chip mounted on the upper surface of the first substrate, and a second terminal connected to the printed circuit board,
wherein the driving chip package covers a portion of an upper surface of the first substrate which extends from an edge of the upper surface of the first substrate and a portion of a side surface of the first substrate which extends from the edge of the upper surface of the first substrate.

19. The display apparatus of claim 18, wherein the driving chip package comprises:
a first surface on which the first terminal is arranged;
a second surface on which the second terminal is arranged; and
a third surface extending between the first and second surfaces, and
wherein the first surface is coupled to the upper surface of the first substrate, the second surface is coupled to the printed circuit board, and the third surface is coupled to the side surface of the first substrate.

* * * * *